US008615727B2

(12) United States Patent
Ghanta et al.

(10) Patent No.: US 8,615,727 B2
(45) Date of Patent: Dec. 24, 2013

(54) SIMULTANEOUS MULTI-CORNER STATIC TIMING ANALYSIS USING SAMPLES-BASED STATIC TIMING INFRASTRUCTURE

(75) Inventors: Praveen Ghanta, Sunnyvale, CA (US); Amit Goel, Santa Clara, CA (US); Feroze P. Taraporevala, Los Altos, CA (US); Marina Ovchinnikov, Saratoga, CA (US); Jinfeng Liu, San Jose, CA (US); Kayhan Kucukcakar, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/970,812

(22) Filed: Dec. 16, 2010

(65) Prior Publication Data

US 2012/0159414 A1    Jun. 21, 2012

(51) Int. Cl.
   *G06F 17/50*    (2006.01)
(52) U.S. Cl.
   USPC ........................................ 716/134
(58) Field of Classification Search
   USPC ................................ 716/100, 134
   See application file for complete search history.

(56) References Cited

U.S. PATENT DOCUMENTS

| 7,739,098 | B2 | 6/2010 | Küçükçakar et al. |
| 7,882,471 | B1 * | 2/2011 | Kariat et al. ................. 716/113 |
| 2005/0114811 | A1 | 5/2005 | Schultz |
| 2007/0156367 | A1 | 7/2007 | Küçükçakar et al. |
| 2007/0234254 | A1 | 10/2007 | Yoshimura |
| 2008/0046848 | A1 | 2/2008 | Tetelbaum et al. |
| 2011/0307226 | A1 * | 12/2011 | Liu et al. ........................... 703/2 |
| 2012/0036171 | A1 * | 2/2012 | Rindner ........................ 708/207 |

OTHER PUBLICATIONS

Press Release: "Mentor Graphics Announces Industry's First Multi-mode Multi-corner Signal Integrity Solution for 65/45nm," Mentor Graphics, Wilsonville, OR, Dec. 10, 2007, http://www.mentor.com/products/ic_nanometer_design/news/multimodemulticornersignalintegritysolution6545nm.
Press Release: "Extreme DA Announces GoldTime MXO for True Optimization of Complex Digital SOC Designs," Business Wire, Santa Clara, CA, Jun. 4, 2008, http://www.reuters.com/article/pressRelease/idUS127984+04-Jun-2008+BW20080604.
Zejda, Jindrich and Paul Frain, "General Framework for Removal of Clock Network Pessimism," IEEE/ACM International Conference on Computer Aided Design, Nov. 10-14, 2002, pp. 632-639.

* cited by examiner

*Primary Examiner* — Suchin Parihar
(74) *Attorney, Agent, or Firm* — Bever, Hoffman & Harms, LLP; Jeanette S. Harms

(57) ABSTRACT

A method of performing simultaneous multi-corner static timing analysis (STA) on a design for an integrated circuit is provided. This method can include reading design data including a netlist, parasitics, and libraries at a plurality of corners. Each corner can represent a set of process, temperature, and voltage conditions. Using the design data as inputs, a plurality of operations can be performed to generate timing reports regarding the design at the plurality of corners. Notably, each operation has a single control flow and uses vectors of samples for performing the plurality of operations. Each sample is a value associated with a corner. This method minimizes computational resource and memory usage as well as accelerates the turn around time of multi-corner analysis.

32 Claims, 15 Drawing Sheets

SIMULTANEOUS MULTI-CORNER STATIC TIMING ANALYSIS USING SAMPLES-BASED STATIC TIMING INFRASTRUCTURE

BACKGROUND OF THE INVENTION

1. Field of the Invention

The present invention relates to static timing analysis and in particular to using samples-based static timing infrastructure for simultaneous multi-corner static timing analysis.

2. Related Art

In sub-65 nm technologies, process and environmental (i.e. voltage and temperature) variations have a significant impact on the timing performance of integrated circuits. To ensure that an integrated circuit design meets the timing requirements in the presence of process and environmental variations, designers can perform static timing analysis for a number of timing "corners", wherein each corner corresponds to one set of process (e.g., slow, fast, nominal, etc.), voltage, and temperature (PVT) conditions. Statistical static timing (e.g. Monte Carlo samples-based static timing) analysis, which has been developed in the last decade, can address the impact of multiple process corners in a computationally efficient manner, but cannot effectively address the impact of voltage or temperature variations.

As a result, current multi-corner static timing analysis (STA) generally runs one corner at a time (either serially using one tool or in parallel using multiple tools). Generally, the number of corners in current technologies can be in excess of ten corners. After running the corners, the timing results obtained for the corners are merged to obtain a set of critical paths or graph nodes across the multiple corners. Because of the number of corners and the merging of the timing results, significant computational resources are required for current static timing analysis.

Therefore, a need arises for a comprehensive timing solution that can efficiently and accurately perform simultaneous STA of multiple timing corners without using separate runs, and which can also quickly generate summary timing reports without the need for explicit merging.

SUMMARY OF THE INVENTION

A method of performing simultaneous multi-corner static timing analysis (STA) on a design for an integrated circuit is provided. This method can include reading design data (e.g., netlist, parasitics and libraries, etc., at a plurality of corners. Each corner can represent a set of process, temperature, and voltage conditions. Using the design data as inputs, a plurality of operations can be performed to generate timing reports regarding the design at the plurality of corners. Notably, each operation has a single control flow and uses vectors of samples for performing the plurality of operations. Each sample is a value associated with a corner.

One operation can include calculating cell and net arc delays. Each cell arc calculation can include performing an arc lookup for each corner, calculating delays for a select subset of corners (e.g. estimated minimum and maximum corners, nominal corner etc.), and estimating delays for corners other than the selected subset of corners. Using the results from the cell arc calculations, a subset of cell arcs (e.g. worst or best) can be selected. At this point, net arc delays can be calculated based on the select subset of cell arcs.

Another operation can include determining when a transparent latch is borrowing or lending. This determination can include, for each transparent latch, computing timing slack sample values (differences between the data arrival times and the required times) and delta values (differences between data-to-output times and clock-to-output times). A determination is made whether a sum of each timing slack value and delta value at a corner is less than or equal to zero. If so, then a borrow/lend value is equal to zero. If not, then the borrow/lend value is equal to the timing slack value. A positive borrow/lend value means time borrowed from a next timing state, whereas a negative borrow/lend value means time lent to the next timing stage.

Yet another operation can include removing clock reconvergence pessimism. This removal can include forming a clock network graph (CNG) for the plurality of corners. Forming the CNG can include, for each divergent clock node, computing rise clock reconvergence pessimism removal (CRPR) samples and fall CRPR samples. These rise and fall CRPR samples can be stored for further processing.

Specifically, the rise and fall CRPR samples can be used to determine whether two nodes in the design are mergeable. In one embodiment, determining whether the two nodes are mergeable can include comparing a first difference between rise CRPRs of the two nodes to a first predetermined threshold. A second difference between fall CRPRs of the two nodes can also be compared to a second predetermined threshold. The two nodes can be merged when the first difference is less than the first predetermined threshold and the second difference is less than the second predetermined threshold.

Another operation of performing simultaneous multi-corner STA is also described. In this method, delay calculations for cell and net arcs of the design can be performed using the design data (e.g., netlist, parasitics and libraries, etc.) to generate a first vector of samples. Each sample of the first vector can represent a cell arc delay value at one of the plurality of corners. Timing updates can be performed using the cell and net delay vectors to generate and propagate arrival and required time vectors throughout the timing graph of the design netlist, and then deriving the timing slack vector as the difference of arrival and required times at every node of the timing graph of the design netlist. Each sample of the timing slack vector represents a slack value at one of the plurality of corners. Timing reports can be generated using the timing slack vectors of all the nodes of the timing graph of the design netlist. The timing reports can include a plurality of vectors, wherein each vector can show the summary (e.g. worst or best) timing data (e.g., arrivals, required times, borrow times, CRPR values, and timing slacks, etc., across the plurality of corners. These timing reports can be output for user review.

A method to use samples-based STA for performing efficient timing analysis for designs with multiple voltage domains, commonly used in recent low-power technologies, is also described. A voltage domain is a set of cells powered by a common voltage regulator. The supply voltage of a domain can fluctuate within a low/high voltage range due to variations in the voltage regulator or voltage drops on power supply grids. Notably, the supply voltage across different voltage domains may vary independently. In such designs, the worst-case timing of within-domain paths as well as cross-domain paths can be captured. Within-domain paths are timing paths of which all the cells and nets are within the same voltage domain. Cross-domain paths are timing paths of which some cells or nets are distributed in different voltage domains. For within-domain paths, two STA runs are needed to capture the worst-case timing. For cross-domain paths, STA must enumerate every low/high voltage combination across the voltage domains, resulting in $2^N$ STA runs to capture the worst-case timing, where N is the number of voltage domains. The requirement for both within-domain and cross-domain STA can be achieved by samples-based STA, by using 2 samples to calculate the timing at low and high voltages for within-domain paths, and using up to $2^N$ samples to calculate timing for cross-domain paths.

Also described is an enhancement for reducing samples needed for cross-domain paths. When a timing path begins in any voltage domain, two samples can be used to compute the timing at low/high voltages of the current voltage domain. When a timing path enters a new voltage domain, the sample count can be doubled to enumerate cross-domain voltage combinations.

DETAILED DESCRIPTION OF THE DRAWINGS

Figure 1:
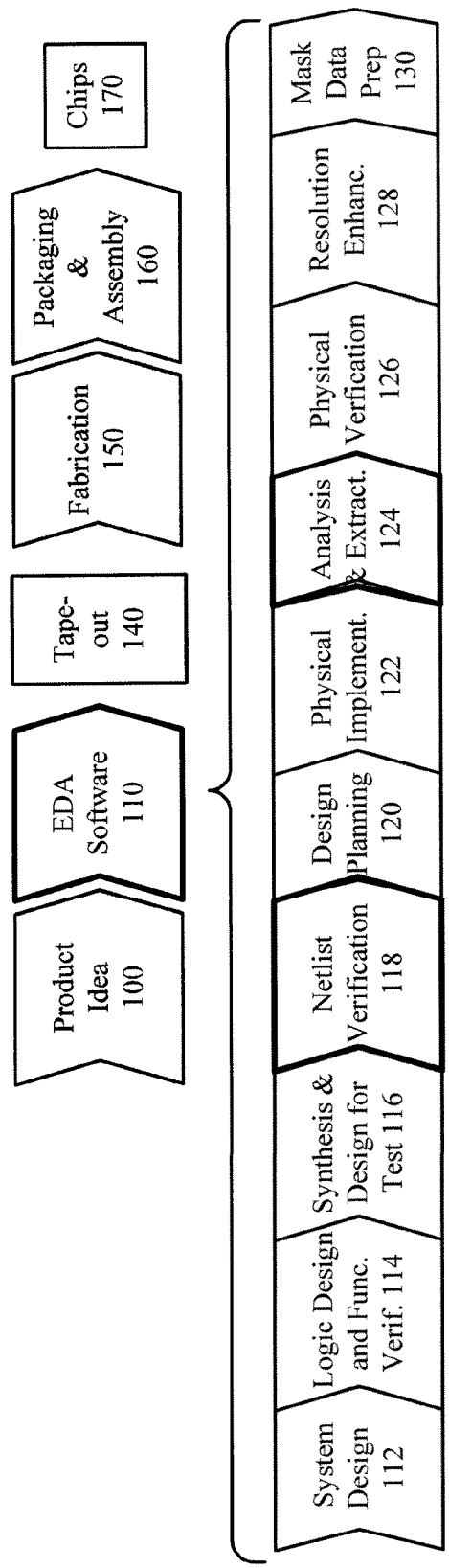
FIG. 1 shows a simplified representation of an exemplary digital ASIC design flow.

FIG. 1 illustrates a simplified representation of an exemplary digital ASIC design flow, which provides the context for the samples-based, multi-corner static timing analysis described below. At a high level, the process starts with the product idea (step 100) and is realized in an EDA software design process (step 110). When the design is finalized, it can be taped-out (event 140). After tape out, the fabrication process (step 150) as well as packaging and assembly processes (step 160) can occur, thereby resulting in finished chips (result 170).

The EDA software design process (step 110) is actually composed of a number of steps 112-110, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 110) will now be provided.

In system design (step 112), the designers can describe the functionality that they want to implement, perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

In logic design and functional verification (step 114), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

In synthesis and design for test (step 116), the VHDL/Verilog code is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

In netlist verification (step 118), the netlist is checked for compliance with timing constraints and for correspondence with the VHDL/Verilog source code. Exemplary EDA software products from Synopsys, Inc. that can be used at this step include Formality, PrimeTime, and VCS products. In one embodiment, the samples-based, multi-corner static timing analysis can be used in step 118.

In design planning (step 120), an overall floorplan for the chip is constructed and analyzed for timing and top-level routing. Exemplary EDA software products from Synopsys, Inc. that can be used at this step include Astro and IC Compiler products.

In physical implementation (step 122), the placement (positioning of circuit elements) and routing (connection of the same) can occur. Exemplary EDA software products from Synopsys, Inc. that can be used at this step include the Astro and IC Compiler products.

In analysis and extraction (step 124), the circuit function is verified at a transistor level, which in turn permits what-if refinement. Exemplary EDA software products from Synopsys, Inc. that can be used at this step include AstroRail, PrimeRail, Primetime, and Star RC/XT products. In one embodiment, the samples-based, multi-corner static timing analysis can be used in step 124.

In physical verification (step 126), various checking functions are performed to ensure correctness for manufacturing, electrical issues, lithographic issues, and circuitry. Exemplary EDA software products from Synopsys, Inc. that can be used at this step include the Hercules product.

In resolution enhancement (step 128), geometric manipulations of the layout can be performed to improve manufacturability of the design. Exemplary EDA software products from Synopsys, Inc. that can be used at this step include Proteus, ProteusAF, and PSMGen products.

In mask data preparation (step 110), the "tape-out" data for production of masks can be lithographically used to produce the integrated circuit chips. Exemplary EDA software products from Synopsys, Inc. that can be used at this step include the CATS® family of products.

Static timing analysis (also called STA herein), which is performed in the netlist verification step 118 and the analysis and extraction step 124, can provide a designer with the "worst case" scenario for a design. Specifically, static timing analysis can define device performance (e.g. performing a set-up check, which can then determine a maximum clock speed for the design) and chip failures (e.g. performing a hold check, which identifies any race condition). In general, static timing analysis takes into account both modes (e.g. functional-voice, functional-data, test-chip configuration, test-design for test, etc.) and corners (i.e. process, voltage, and test).

As described in further detail below, statistical static timing (e.g. Monte Carlo samples-based static timing) analysis can be modified to address the impact of process variations as well as voltage and temperature variations. Such modifications can ensure that efficient and accurate static timing analysis of multiple corners can be performed simultaneously. That is, the stages of STA, i.e. computation, propagation, and data mining, for multiple corners can be done simultaneously. More specifically, each stage can be leveraged across the multiple corners.

Figure 2A:
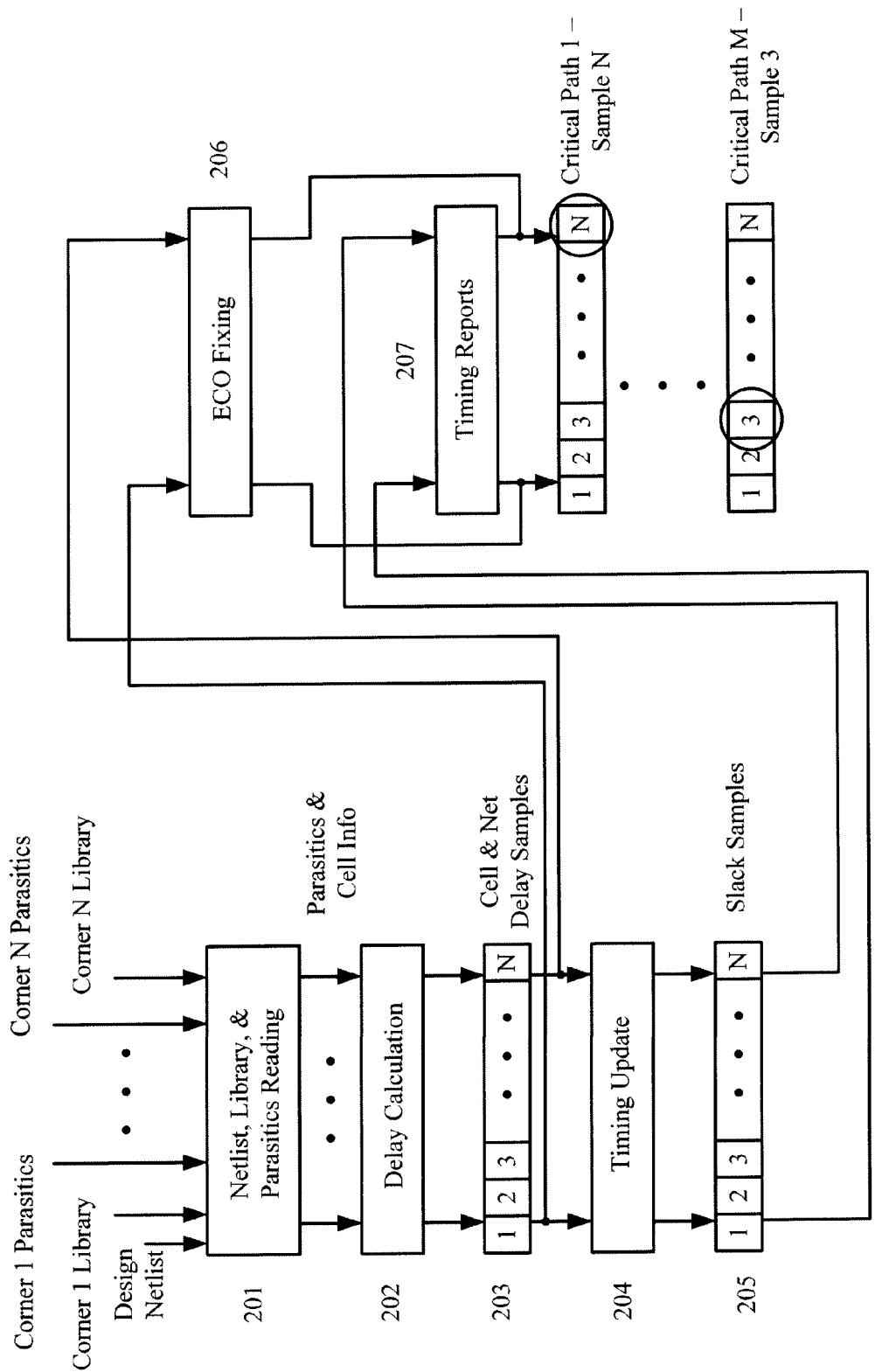
FIG. 2A illustrates an exemplary samples-based multi-corner static timing analysis.

Computation can include any one of multiple aspects of STA, e.g. delay calculation, latch borrowing, clock re-convergence pessimism removal (CRPR), etc. For example, FIG. 2A illustrates an exemplary delay calculation using samples-based multi-corner STA. In FIG. 2A, netlist, library, and parasitics reading can be performed in step 201 using as inputs a design netlist, corner libraries 1-N, and corner parasitics 1-N, wherein N is a positive integer (typically chosen by the EDA tool) that designates a specific corner. A delay calculation can be performed in step 202 using the cell information from the netlist, libraries, and parasitics, and other design data. Notably, such delay calculation can consolidate information for all corners to generate cell and net delay samples 203. These samples can be used for timing update in step 204 to generate slack samples 205. During timing update the delays of the cells and nets for specific paths can be aggregated (i.e. added) to obtain the arrival times for those paths. As known by those skilled in the art, the difference between an arrival time for a capture path and an arrival time for a launch path yields the slack value. In one embodiment, using the various arrival times generated by the timing update, step 204 can generate slack samples 205.

Figure 2B:
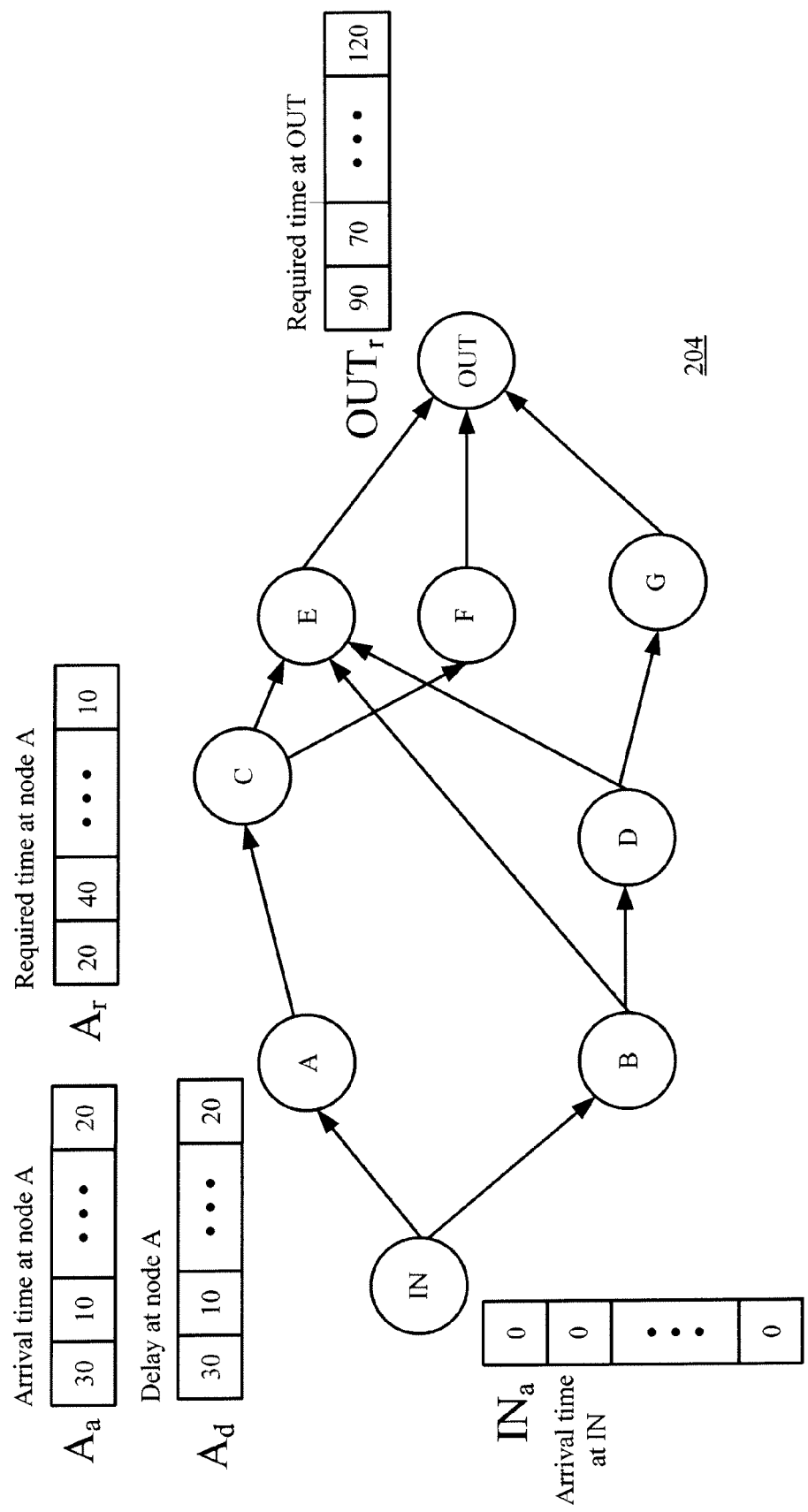
FIG. 2B illustrates an exemplary timing update that can be performed during samples-based multi-corner static timing analysis.

FIG. 2B illustrates an exemplary timing graph of a design netlist with cells denoted by the nodes A-G, and a timing stage input node IN and a timing stage output node OUT. The arrows connecting the cells represent the nets of the design netlist. During timing update 204, for every node in the timing graph starting with the input node IN and ending with the output node OUT, the arrival times at each node's output are computed as the sum of the delay samples of the cell represented by the node and the arrival times at the node's input. Similarly, for every node in the timing graph starting with the output node OUT and ending with the input node IN, the required times at each node's input are computed as the difference of the arrival times at the node's output and the delay samples of the cell represented by the node. Later in the timing update process, the timing slack of every node is computed as the difference of the arrival and the required times at the node's output.

Referring back to FIG. 2A, the summary timing data of a timing graph of the design netlist across the plurality of corners (shown as cell and net delay samples in vector 203) can be used for engineering change order (ECO) fixing of critical timing paths. Timing reports can be generated in step 207 using the slack samples, i.e. determining whether timing passes or fails, and other information (not shown for simplicity). These timing reports in combination with engineering change order (ECO) fixing 206 can generate critical paths 1-M/, wherein M is a positive integer that varies based on the design. Note that each critical path can identify a worst slack value for samples 1-N, e.g. critical path 1 shows a worst slack for sample N and critical path M shows a worst slack for sample 3. Other characterizations of timing reports 207 can include a timing slack sample corresponding to one corner (e.g. worst, best, etc.) as well as summary timing data regarding arrivals, required times, borrow times, and CRPR values. In one embodiment, ECO fixing across the plurality of corners for each critical timing path can include modifying the path and/or another design netlist (e.g. sizing up or down existing cells and nets and/or inserting new cells or nets, etc.) so as to improve the timing slack of that critical timing path to be less than a predetermined threshold.

Further note that although a one-to-one mapping between libraries and parasitics is shown as inputs to step 201, other embodiments may have other than a one-to-one mapping (e.g. 1-N libraries, but 1-Q parasitics, wherein Q is an integer not equal to N).

Figure 3A:
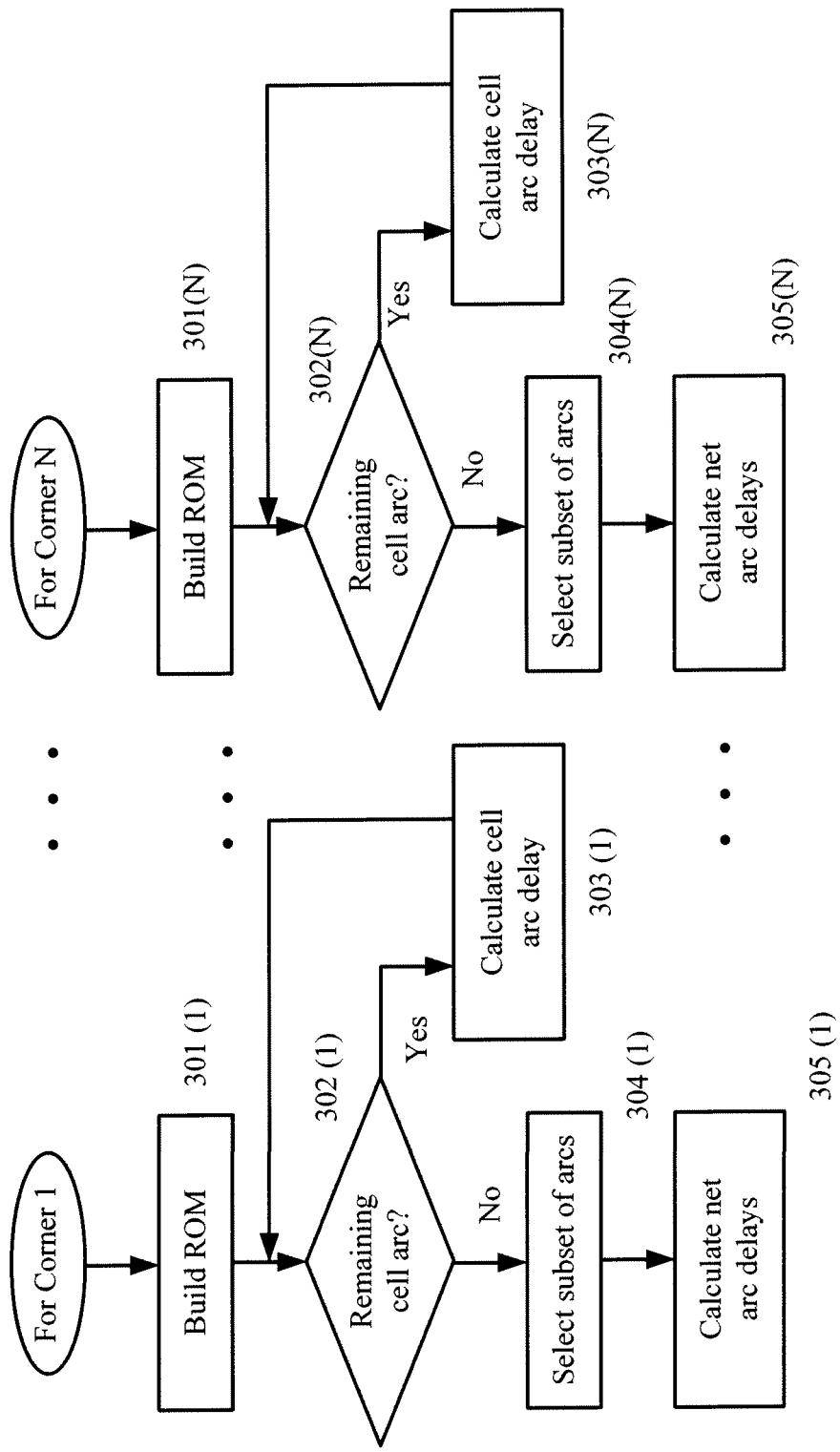
FIG. 3A illustrates a conventional delay computation for static timing analysis.

Note that each operation of FIG. 2A is not merely running identical operations in parallel. For example, FIG. 3A illustrates a conventional flow in which delay computations are performed simultaneously for corners 1-N by running multiple operations in parallel. For simplicity, assume that the delay computations are being performed based on one or more arcs of a logic gate (wherein the arc is from an input terminal of the logic gate to an output terminal of that logic gate, e.g. an inverter would have a single arc, but a NAND gate would have two arcs (one from each input terminal to its single output terminal)). Steps 301(1)-301(N) build reduced order models (ROMs) for the interconnect for corners 1-N. If a cell arc remains to be analyzed as determined by steps 302(1)-302(N), then steps 303(1)-301(N) calculate the cell arc delays. Once all cell arcs for the cell are analyzed (steps 302(1)-302(N)), then steps 304(1)-304(N) pick a select subset (e.g. worst, best, etc.) of arcs. Steps 305(1)-305(N) use this subset of arcs to calculate the net arc delays for all corners. Note that by using multiple tools or a tool capable of multi-tasking, the steps of FIG. 3A can be performed in parallel, e.g. steps 301(1)-301(N) can be performed substantially simultaneously.

Figure 3B:
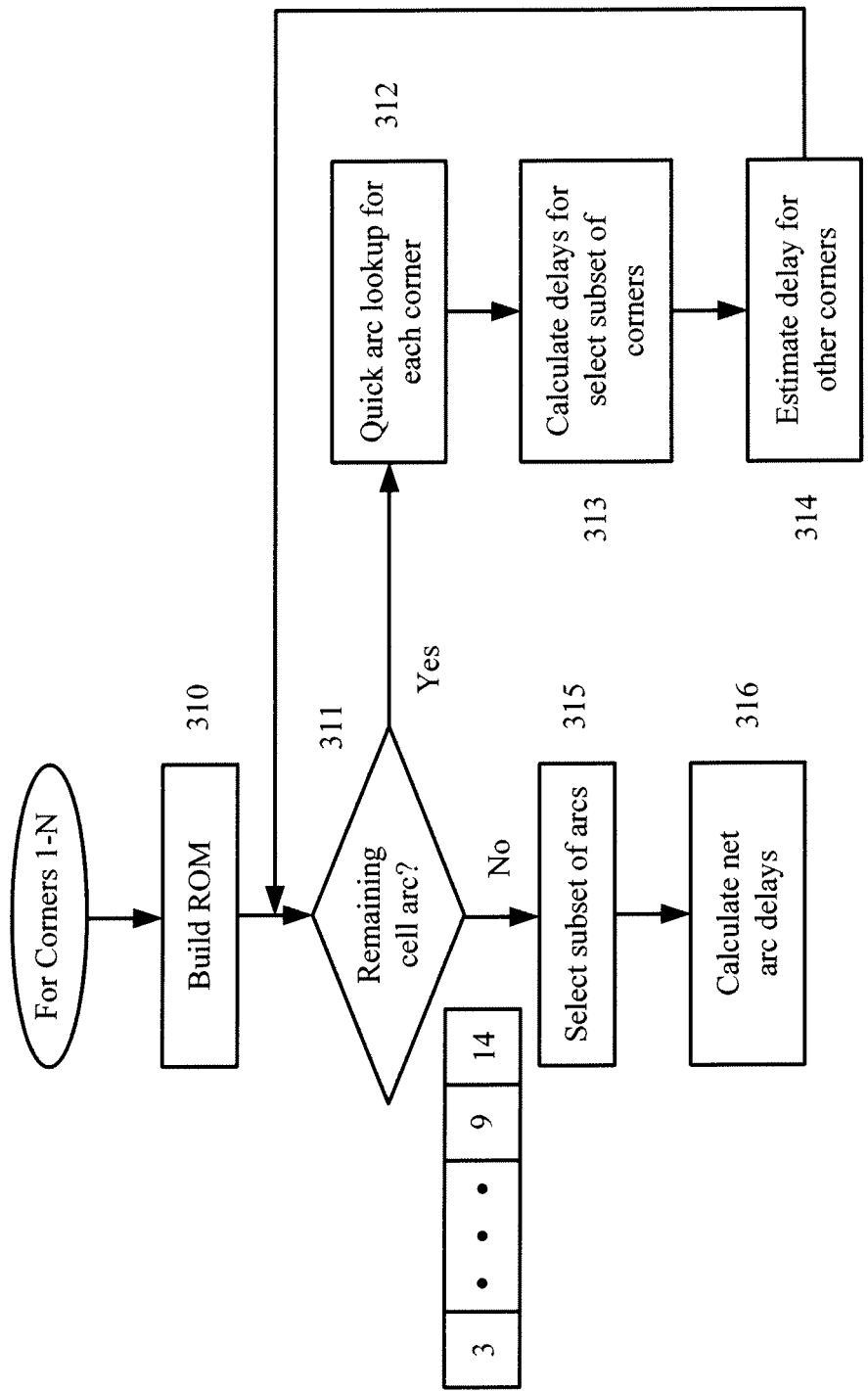
FIG. 3B illustrates an exemplary samples-based delay computation for static timing analysis.

In contrast, FIG. 3B illustrates a delay computation that leverages timing infrastructure across multiple corners. Step 310 builds ROMs for corners 1-N. If an arc for a cell remains to be analyzed as determined by step 311, then step 312 performs a quick arc lookup for each corner (e.g. using the libraries discussed above). Using that lookup, step 313 can then calculate the delays for a select subset (e.g. minimum, maximum, nominal, etc.) of corners for that arc. Using the same lookup, step 314 can then estimate the delays for the corners other than the selected subset of corners. After all delays for all cell arcs in the design are estimated (step 311), then step 315 picks a select subset (e.g. worst, best, etc.) of arcs and step 316 calculates the net arc delays using the select subset of arcs.

Notably, each of steps 312-314 can perform an operation applicable to multiple corners using a single control flow. Thus, in contrast to FIG. 3A, in which identical operations are performed in parallel for each of the corners (i.e. a control flow for each corner), the technique of FIG. 3B effectively consolidates the multiple control flows into one control flow that can leverage information regarding all the corners. Note that this leveraging also consolidates the payloads previously associated with multiple control flows. That is, the data for performing the delay computations, which can be referred to as payloads, for the corners can now be consolidated into a single payload. This consolidated control flow and payload can advantageously minimize resource usage (e.g. memory requirements and processor utilization) while still providing accurate outputs.

Referring back to FIG. 2A, the delay calculation performed in step 202 (one embodiment described in FIG. 3B) can generate a vector of samples (in this case, cell and net arc delay samples) for corners 1-N. As indicated above, this delay calculation was performed using a technique having a consolidated control flow and payload leveraged across multiple corners. Similar techniques across multiple corners can be used for steps 204 and 207.

Note also that ECO fixing in step 206 can also take advantage of this information consolidation across corners. Specifically, in conventional STA, ECO fixes have been performed using cell and net arc delays computed separately for each corner. Such ECO fixes are typically complex and take considerable time for the designer to accomplish. In contrast, a samples-based STA can allow a designer to look at the sample values from all critical paths holistically, thereby facilitating judicious selection of ECO fixes.

Further note that the corner libraries used for inputs may not provide the specific PVT of interest to the designer. In accordance with one aspect of the samples-based STA, the consolidated control flow and payload technique can facilitate the interpolation between PVTs provided by the corner libraries.

Notably, the consolidated control flow and payload technique can be applied to other aspects of STA. For example, this technique can be applied to handling of transparent or level-sensitive latches in the design netlist, which is briefly described below for context. A flip-flop or an edge-triggered latch is a clocked device that transfers data stored at its input pin to its output pin once a triggering clock pulse arrives (i.e. the flip-flop is edge triggered). A transparent or a level-sensitive latch is a clocked device in which the output captures the input when the clock pulse is high. More specifically, as long as the clock pulse is high, then the output can change anytime the input changes. A transparent latch is triggered by the active time of the clock as well as the clock edge. Time borrowing can occur when two pipelined stages of logic are bounded by transparent latches. For example, if the first stage of logic has a much longer (or shorter) delay than the second stage of logic, then a designer can "borrow" (or "lend") some of the time of the second stage for the first stage.

Figure 4A:
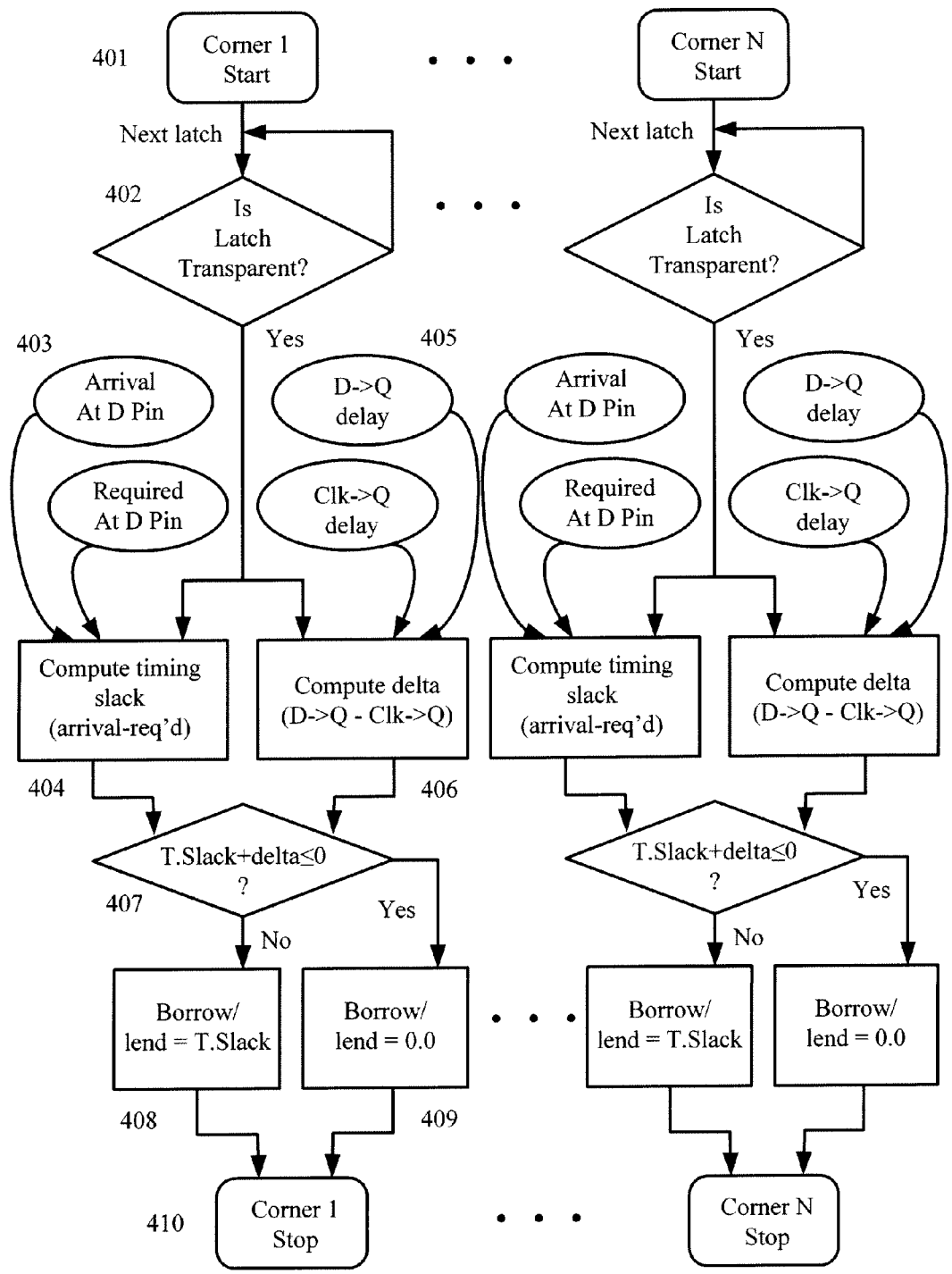
FIG. 4A illustrates a conventional technique for handling transparent latches in static timing analysis.

FIG. 4A illustrates a conventional technique for handling transparent latches in STA. Step 401 begins by identifying the next latch in the design. Step 402 determines whether that latch is a transparent latch. If the latch is not a transparent latch, then the next latch is identified. If the latch is a transparent latch, then step 404 receives inputs 403, which include the actual arrival time and the required time (including a user-set constraint) at the D pin (the input terminal). Step 404 then computes timing slack by subtracting the required time from the arrival time. Note that step 404 effectively determines whether a timing violation occurs. Concurrently, step 406 receives inputs 405, which include the D pin to Q pin delay (Q being the output terminal) and the CLK pin to Q pin delay. Step 406 computes a "delta" by subtracting the CLK to Q delay from the D to Q delay. Note that the delta value must be taken into account only when a timing violation occurs (as indicated by the timing slack value). However, for ease of computation, the delta value is computed for each transparent latch (noting that the timing slack value is being computed in parallel).

Step 407 determines whether the timing slack plus the delta is less than or equal to zero (i.e. non-positive). If so, then step 409 indicates that the latch has a borrow/lend value of zero (wherein borrow/lend means that the latch has either a "borrow" or a "lend" characteristic). If not, then step 408 indicates that the latch has a borrow/lend value equal to the value computed in step 404. Step 410 ends the borrow/lend determination. Note that although steps 401-410 are described as being performed for corner 1, similar steps are performed for all corners, i.e. corners 1-N.

Figure 4B:
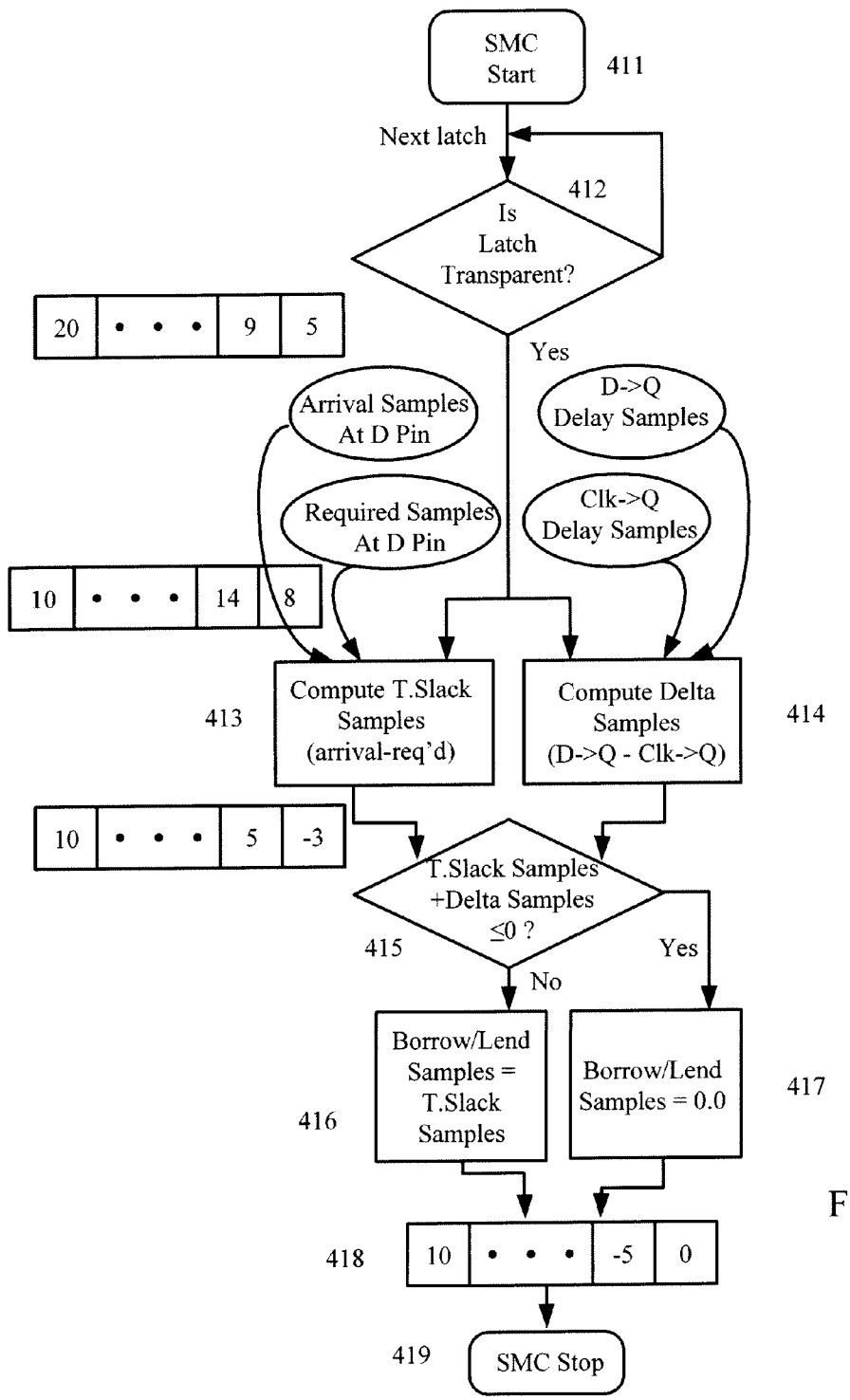
FIG. 4B illustrates an exemplary samples-based technique for handling transparent latches across corners in static timing analysis.

FIG. 4B illustrates a samples-based technique for handling transparent latches across a plurality of corners in STA. Step 411 begins by identifying the next latch in the design. Step 412 determines whether that latch is a transparent latch. If the latch is not a transparent latch, then the next latch is identified. If the latch is a transparent latch, then step 413 receives arrival and required samples for all corners, and computes the timing slack samples by subtracting the required times from the arrival times for all corners. Concurrently, step 414 receives D to Q delay samples and CLK to Q delay samples and computes "delta" samples by subtracting the CLK to Q delays from the D to Q delays for all corners. (Note that exemplary input and output vectors for the samples described in step 413 are shown for reader understanding—similar input and output vectors are used for any steps involving samples, but are not shown for simplicity.) Step 415 determines whether the sum of each timing slack sample in the timing slack vector and the corresponding delta sample in the delta vector is less than or equal to zero (i.e. the sum applies to corresponding positions in the two vectors). If so, then step 417 indicates that the designated sample of vector 418 has a borrow/lend value of zero. If not, then step 416 indicates that the designated sample of vector 418 has a borrow/lend value equal to the timing slack value (computed in step 413). Note that a negative value in vector 418 implies that the latch is lending to the next stage, whereas a positive value implies that the latch is borrowing from the next stage. Step 419 ends the borrow/lend determination.

Figure 5:
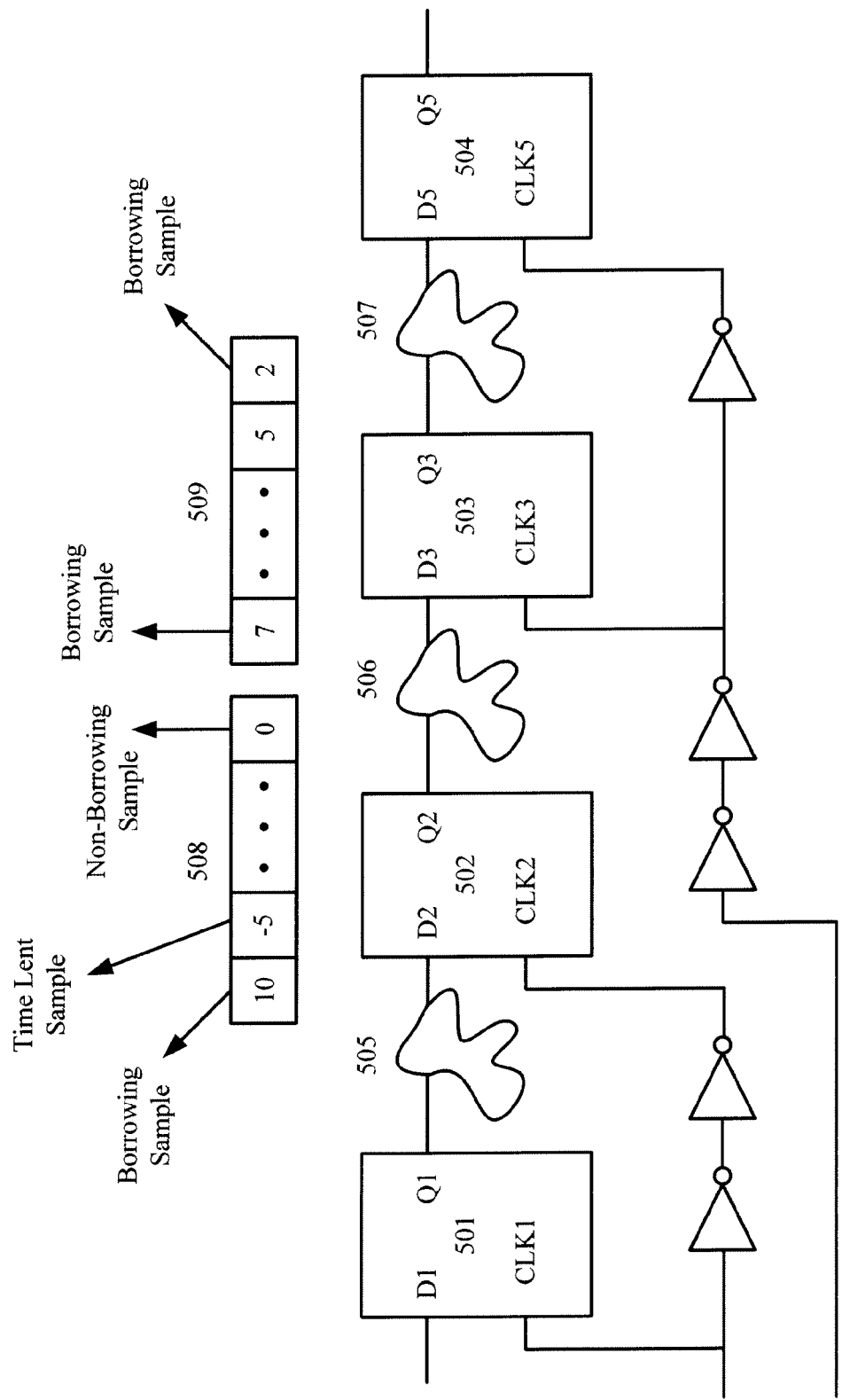
FIG. 5 illustrates a simple circuit including transparent latches, wherein each transparent latch has a vector with multiple samples, each sample being associated with a corner. In this embodiment, a zero value indicates a non-borrowing sample whereas a non-zero value indicates a borrowing sample.

For further illustration, FIG. 5 illustrates an exemplary set of transparent latches 501, 502, 503, and 504, which connects logic configurations 505, 506, and 507. In the configuration shown in FIG. 5, latches 501, 502, 503, and 504 receive clock signals CLK1, CLK2, CLK3, and CLK4, respectively. Vectors 508 and 509 are samples-based vectors (see, vector 418 of FIG. 4) for latches 502 and 503, respectively. In FIG. 5, a non-zero value for a sample of either vector 508 or 509 represents a "borrowing" sample with a value (in designated units) commensurate with the amount of borrowing needed from the next transparent latch in the pipeline to ensure no timing error occurs. For example, for the first sample in vector 508 (of latch 502), 10 units (e.g. picoseconds) need to be borrowed from latch 503. A zero value for a sample of either vector 508 or 509 represents a "non-borrowing" sample, i.e. no borrowing is necessary.

Note that the order of the samples in the vectors can be consistent across the vectors to facilitate the computations described in reference to FIG. 4B. Thus, for example, the first samples of vectors 508 and 509 (FIG. 5) indicate that the timing between Q2 and D3 improves by 3 units (10-7). Indeed, by using the samples-based latch borrowing technique, the STA engine can easily determine if convergence is possible for an existing sequence of transparent latches in a few iterations, in which the latches are processed one after another in a select sequence. Note that such borrowing is limited to transparent latches only that are serially connected through combinational elements such as cells and nets. Thus, a flip-flop in the pipeline effectively ends the ability of a transparent latch to borrow from downstream transparent latches in the pipeline, which is well known to those skilled in the art of STA. In one embodiment, multiple iterations of the samples-based latch borrowing technique (FIG. 5) may be performed for the design over time until all transparent latches are settled.

Figure 6A:
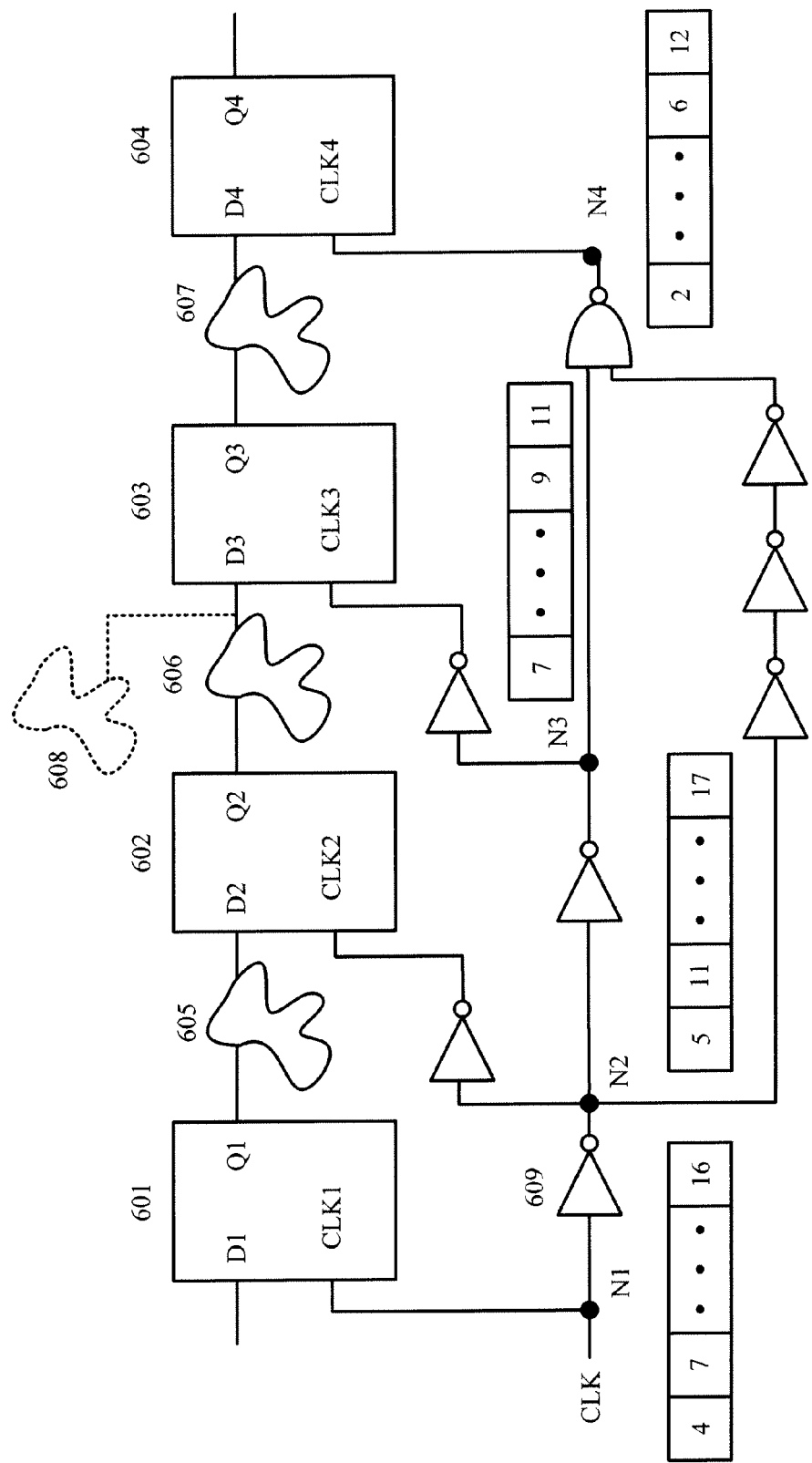
FIG. 6A illustrates a simple circuit including flip-flops, wherein each clock network node has a vector with multiple samples, each sample being associated with a corner. In this embodiment, the vectors form a clock network graph (CNG) for clock reconvergence pessimism removal (CRPR).

Notably, the consolidated control flow and payload technique can be applied to yet other aspects of STA. For example, this technique can be applied to clock reconvergence pessimism removal (CRPR), which is briefly described herein for context. FIG. 6A illustrates an exemplary set of flip-flops 601, 602, 603, and 604, which connects logic configurations 605, 606, and 607. In the configuration shown in FIG. 6A, flip-flops 601, 602, 603, and 604 receive clock signals at pins CLK1, CLK2, CLK3, and CLK4, respectively. Note that all clock signals are derived from CLK, i.e. the signal received at pin CLK2 is a buffered CLK signal (based on two inverters), the signal received at pin CLK3 is an inverted CLK signal (based on three inverters), and the signal received at pin CLK4 is a buffered and logic-conditional CLK signal (based on two inverters and a NAND gate).

As the acronym indicates, CRPR relates to reducing pessimism in the clock network. For example, referring to the data path from Q2 to D3, node N2 is the common node between a first clock path going to the CLK2 pin (flip-flop 602, which has output pin Q2) and a second clock path going to the CLK3 pin (flip-flop 603, which has output pin Q3). In defining this data path in STA, a launch path can be defined as including nodes N1 and N2 and pins CLK2, Q2, and D3, whereas a capture path can be defined as including nodes N1, N2, N3 and pin CLK3.

Typically, to be conservative in timing in STA, the data is timed to be as slow as possible and the clock is timed to be as fast as possible. This assumption creates a significant problem in STA. For example, consider inverter 609, which is between nodes N1 and N2. Inverter 609 is common to the launch and capture path. To be conservative in STA, inverter 609 has to be timed as "slow" for the launch path and "fast" for the capture path, which is physically impossible in a real manufactured circuit, and which thus leads to unnecessary pessimism in STA. CRPR can be used to get rid of this unnecessary pessimism. Specifically, CRPR can remove the difference between slow and fast (i.e. minimum arrival time and maximum arrival time) for the common elements of the launch and capture paths.

To perform this function, the complexity of the graph-based analysis may also be considered. That is, if multiple logic configurations feed into an input pin, e.g. logic configurations 606 and 608 (with an associated upstream flip-flop, not shown for simplicity), then determining the launch and capture paths becomes confusing. A CNG (clock network graph) can be used to group cells in the design, thereby allowing commonalities between cell groups to be eliminated. Note that CNG is discussed in further detail in an article authored by Jindrich Zejda and Paul Frain, entitled, "General framework for removal of clock network pessimism", which was published in *ICCAD* 2002: 632-639.

Figure 6B:
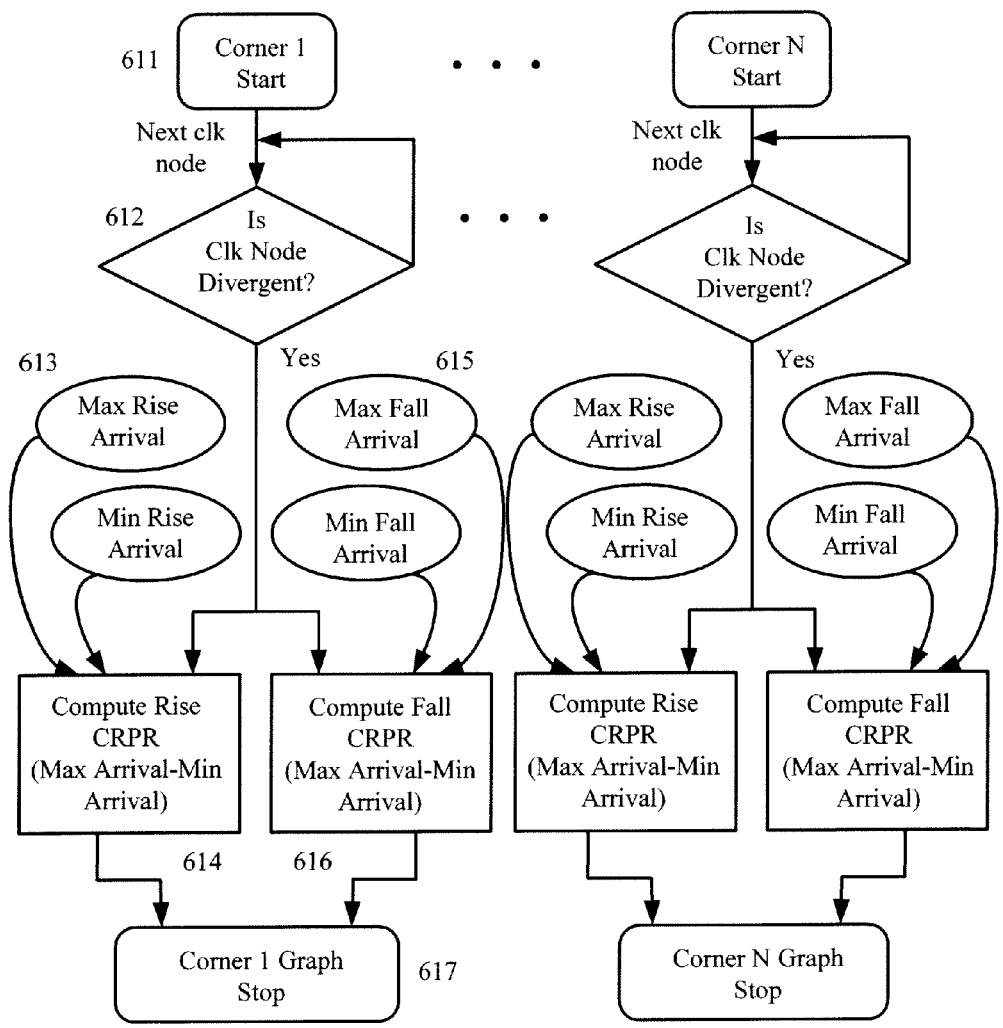
FIG. 6B illustrates a conventional technique for generating CNGs for multiple corners.

In accordance with one aspect of CRPR, the CNG is first created, followed by merging certain nodes of the CNG. FIG. 6B illustrates a conventional technique for creating the CNGs for all corners. Step 611 begins by identifying the next clock node in the design. Step 612 determines whether that clock node is a divergent clock node (e.g. in FIG. 6A, node N2 is a divergent clock node when considering the data path Q2 to D3). If the clock node is not a divergent clock node, then the next clock node is identified. If the clock node is a divergent clock node, then step 614 receives inputs 613, which include the maximum rise arrival time and the minimum rise arrival time at the clock node. Step 614 then computes a rise CRPR by subtracting the minimum rise arrival time from the maximum rise arrival time. Concurrently, step 616 receives inputs 615, which include the maximum fall arrival time and the minimum fall arrival time at the clock node. Step 616 computes a fall CRPR by subtracting the minimum fall arrival time from the maximum fall arrival time. Step 617 stores the rise and fall CRPRs for each divergent clock node in the design for corner 1, which forms the CNG for corner 1. Note that although steps 611-617 are described as being performed for corner 1, similar steps are performed for all corners, i.e. corners 1-N.

Figure 6C:
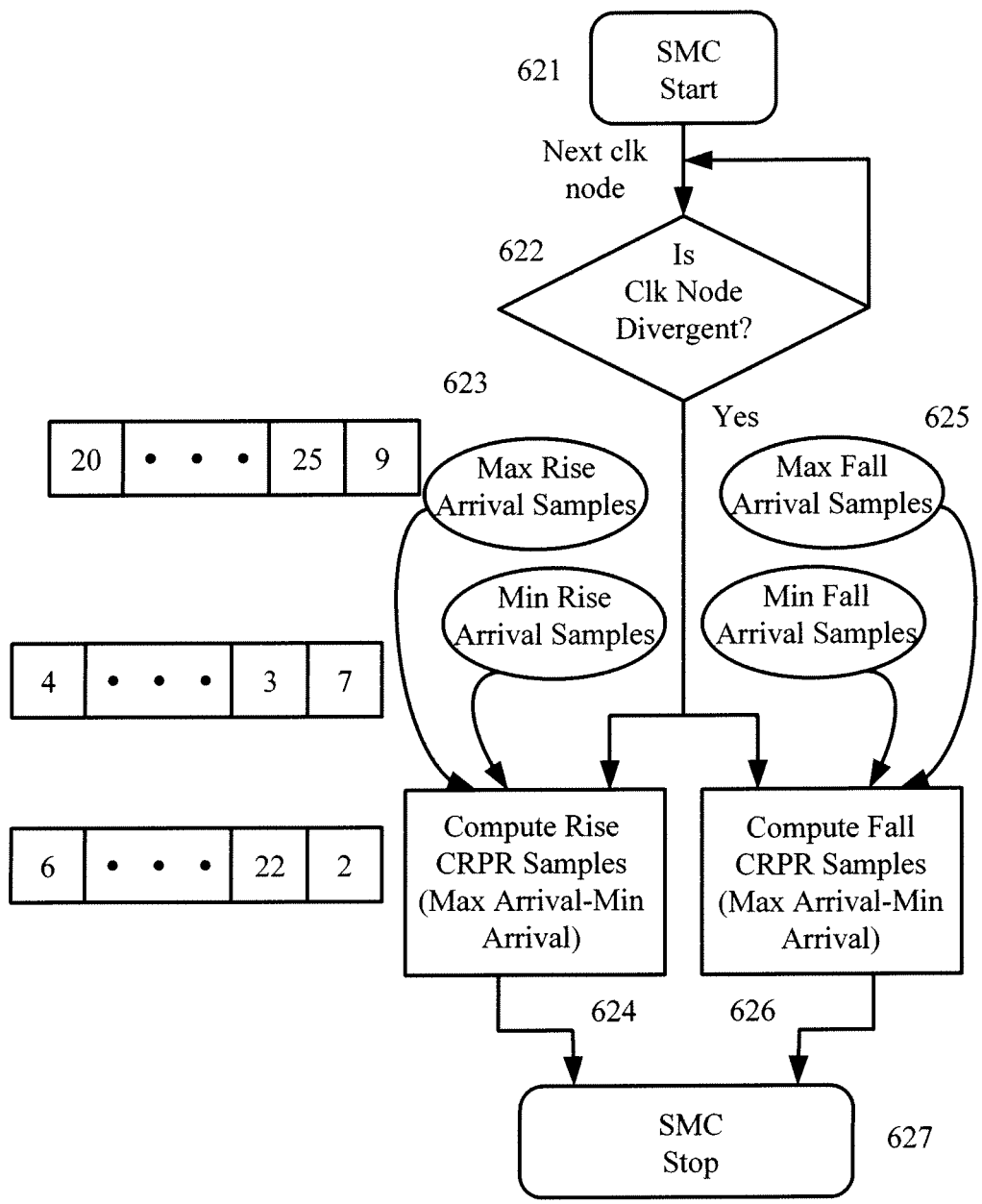
FIG. 6C illustrates an exemplary samples-based technique for generating a CNG for multiple corners.

FIG. 6C illustrates a samples-based technique for generating a CNG for all corners. Step 621 begins by identifying the next clock node in the design. Step 622 determines whether that clock node is a divergent clock node. If the clock node is not a divergent clock node, then the next clock node is identified. If the clock node is a divergent clock node, then step 624 receives inputs 623, which include vectors of samples of the maximum rise arrival times and the minimum rise arrival times at the clock node. Step 624 then computes rise CRPR samples by subtracting the minimum rise arrival times from the maximum rise arrival times (wherein samples having the same position in the vectors preferably refer to the same corner, thereby facilitating the operation in step 624). Concurrently, step 616 receives inputs 625, which include vectors of samples of the maximum fall arrival times and the minimum fall arrival times at the clock node. Step 626 computes fall CRPR samples by subtracting the minimum fall arrival times from the maximum fall arrival times. Step 627 stores the vectors of samples of the rise and fall CRPRs for divergent clock nodes in the design for all corners, which forms the CNG for corners 1-N.

Figure 6D:
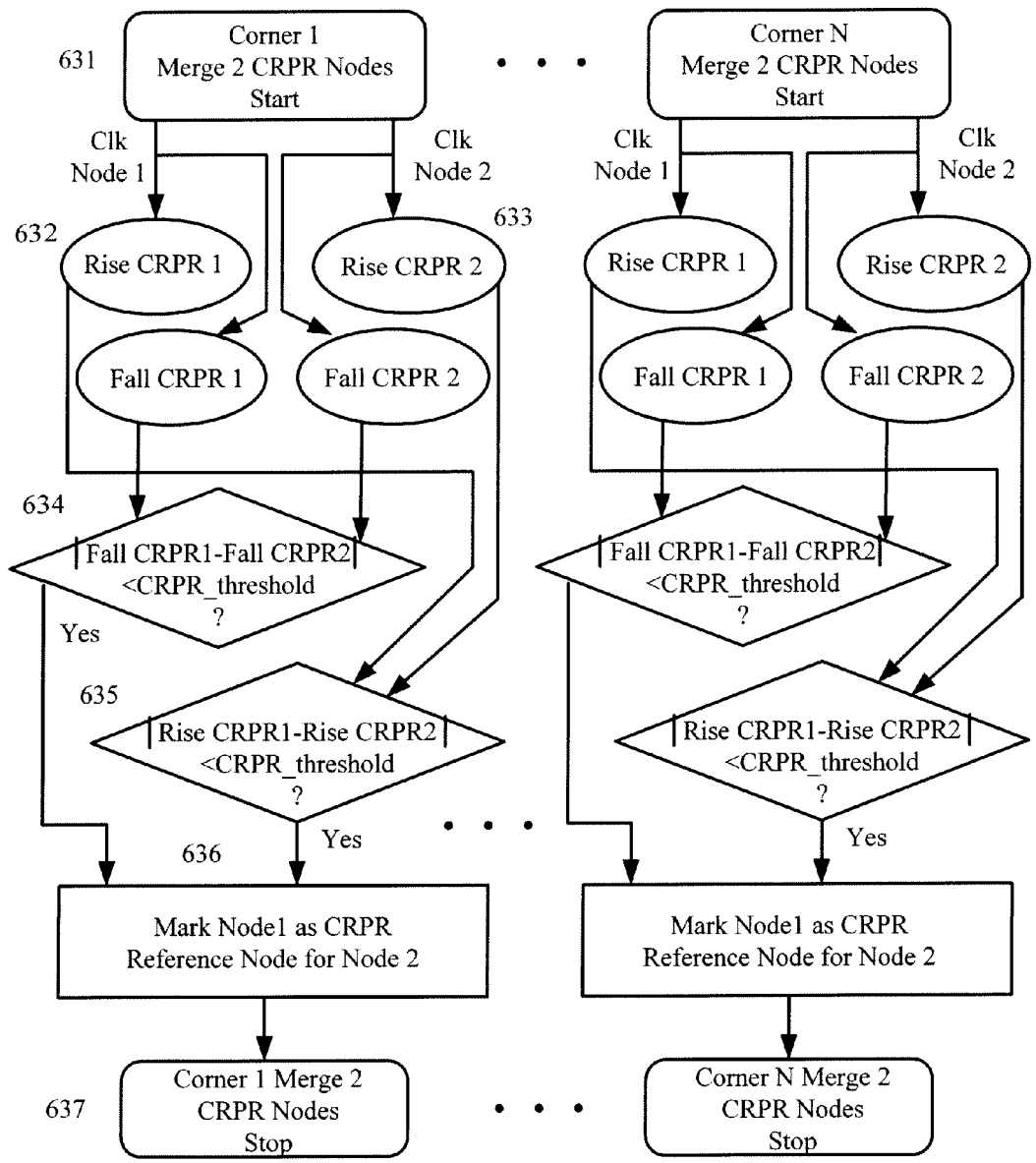
FIG. 6D illustrates a conventional technique for performing CRPR using the CNGs for multiple corners.

FIG. 6D illustrates a conventional technique for providing CRPR. Step 631 identifies two divergent clock nodes (generically described herein as node 1 and node 2) (referring back to FIG. 6A, nodes 1 and 2 could be nodes N1 and N2, or nodes N2 and N3, either of which form a set of divergent clock nodes). Step 634 determines whether the absolute value of the difference between fall CRPR1 and fall CRPR2 (provided via inputs 632 and 633) is less than a predetermined CRPR threshold (typically user-defined as an input to STA). If so, then step 636 marks node 1 as a CRPR reference node for node 2 (i.e. the data related to node 2 is deleted and any future STA process involving node 2 is directed instead to node 1). Step 636 determines whether the absolute value of the difference between rise CRPR1 and rise CRPR2 (also provided via inputs 632 and 633) is less than a predetermined CRPR threshold (which can be the same or different than the previously-described threshold). If so, then step 636 marks node 1 as a CRPR reference node for node 2. Note that a "true" determination in either of steps 634 and 635 results in the marking of the node in step 636. On the other hand, if a "false" determination is made in either of steps 634 and 635, then the two nodes are not merged (not shown for simplicity). Therefore, once either step 634 or 635 meets the threshold requirement and marking is performed in step 636, merging can be ended in step 637. Note that although steps 631-637 are described as being performed for corner 1, similar steps are performed for all corners, i.e. corners 1-N.

Figure 6E:
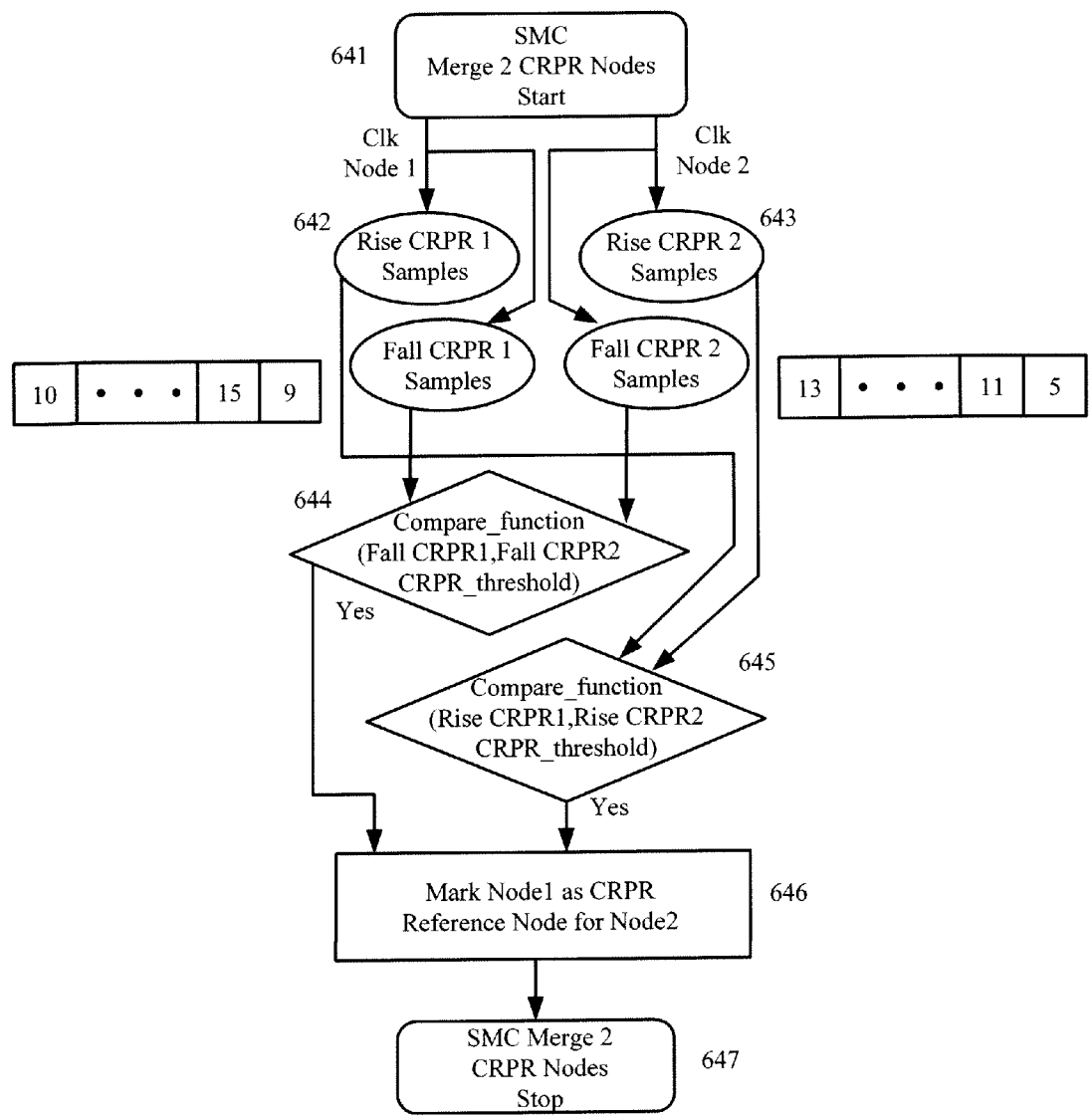
FIG. 6E illustrates an exemplary samples-based technique for performing samples-based CRPR using the CNG vector.

FIG. 6E illustrates a samples-based technique for providing CRPR. Step 641 identifies two divergent clock nodes, e.g. nodes 1 and 2. Step 644 determines whether the absolute value of the difference between samples of fall CRPR1s and fall CRPR2s (provided via vectors 642 and 643) is less than a predetermined CRPR threshold. If so, then step 636 marks node 1 as a CRPR reference node for node 2. Step 634 determines whether the absolute value of the difference between fall CRPR1 and fall CRPR2 (also provided via vectors 642 and 643) is less than a predetermined CRPR threshold (typically user-defined as an input to STA). If so, then step 636 marks node 1 as a CRPR reference node for node 2. Step 637 ends the merge of nodes 1 and 2 for corners 1-N. On the other hand, if a "false" determination is made in either of steps 644 and 645, then the two nodes are not merged (not shown for simplicity). In one embodiment, this false determination may be based on the maximum difference value in the vector, i.e. determining whether that maximum difference value is less than the predetermined threshold CRPR_threshold.

Note that from the perspective of a CNG, it may be overly ambitious to determine the specific merging of nodes to obtain optimized pessimism removal. However, a reasonable goal is to remove at least some pessimism, thereby reducing data storage. Note that conceptually all pair wise nodes are selected and compared one pair at a time. However, in one embodiment, for efficiency in computer processing, all nodes can be sorted in the order of CRPR values, and then all nodes with the same CRPR can then be topologically sorted. Then, the node with the smallest CRPR value can be picked as a pivot node and all the other nodes can be compared against it and merged with the pivot node if the CRPR different is less than the predetermined threshold as described in the technique described in FIG. 6B. If the next node cannot be merged with the smallest node, then this next node becomes the pivot node and all the remaining nodes are compared against it, and so on.

For example, referring back to FIG. 6A, perhaps node N3 can be ignored, and node N2 can be designated the common node for both data paths Q2 to D3 as well as Q3 to D4. In this case, less data can be stored for the CNG because the difference between min and max data related to the delay between nodes N2 and N3 can be taken out. Note that in state of the art designs, a million nodes or more may be initially present. In one embodiment, using CRPR, the number of nodes can be reduced significantly by an order of magnitude. Note that in addition to reducing memory space, reducing the number of nodes can also reduce potential computations, thereby reducing STA runtime.

Note that the samples-based STA described above can be applied to other STA operations including, but not limited to, reporting, crosstalk, and noise computation.

As indicated above, performing multi-corner, samples-based STA can provide significant advantages compared to conventional STA. For example, because there is only a single run and the timing infrastructure (e.g. reading netlist, reading parasitic data, building timing graph, etc.) is shared by all the corners, the computational resources that are necessary for multi-corner analysis are minimized. This sharing becomes even more advantageous when using distributed multi-core timing analysis, in which even a single corner run requires multiple machines (typically more than 5 machines). Distributed multi-core timing analysis is described in further detail in U.S. Pat. No. 7,739,098, entitled "SYSTEM AND METHOD FOR PROVIDING DISTRIBUTED STATIC TIMING ANALYSIS WITH MERGED RESULTS", issued on Jun. 15, 2010, which is incorporated by reference herein.

Moreover, executing the control logic code and other shared logic timing code only once for all the corner samples can provide inherent computational speed-ups compared to several single-corner runs. Also, given the shared infrastructure and quick access to all the multi-corner arrival and slack timing samples, summary/reporting tasks such as identifying the critical path set in report timing can be performed efficiently in an implicit manner, by simply looking across all the samples at any timing node. In contrast, in many current multi-corner flows, the timing results from each individual corner must be explicitly merged to obtain a critical path set. Notably, as shown by the above CRPR embodiment, the shared timing infrastructure may also present opportunities to reduce the capacity because the run data across the multiple corners can be compressed (encoded) without much loss of accuracy. U.S. patent application Ser. No. 12/814,421, entitled "EFFICIENT DATA COMPRESSION FOR VECTOR-BASED STATIC TIMING ANALYSIS", filed on Jun. 11, 2010, and incorporated by reference herein, describes various techniques for data compression.

The samples-based STA described above can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

The embodiments described herein are not intended to be exhaustive or to limit the invention to the precise forms disclosed. As such, many modifications and variations will be apparent. For example, reusing existing samples-based timing engine provides a great opportunity to readily reuse the infrastructure and applications that were developed for statistical static timing, for multi-corner analysis as well. For example, multi-corner analysis can be speeded-up significantly by employing statistical static timing methods such as variational parasitics handling, and fast delay calculation methods (e.g. scaling, numerical regression models) to efficiently compute cell delays across multiple corners in almost constant time. Further examples include the ability to reuse multi-core programming techniques such as multithreading and distributed analysis, which are currently being employed for static timing analysis.

Note that a samples-based STA technique can be used to perform efficient timing analysis for a circuit design with multiple voltage domains. A voltage domain is a set of cells powered by a common voltage regulator. The supply voltage of a domain can fluctuate within a low/high voltage range due to variations in the voltage regulator or voltage drops on power supply grids. Notably, the supply voltage across different voltage domains may vary independently. In such designs, the worst-case timing of within-domain paths as well as cross-domain paths can be captured. Within-domain paths are timing paths of which all the cells and nets are within the same voltage domain. Cross-domain paths are timing paths of which some cells or nets are distributed in different voltage domains.

Figure 7A:
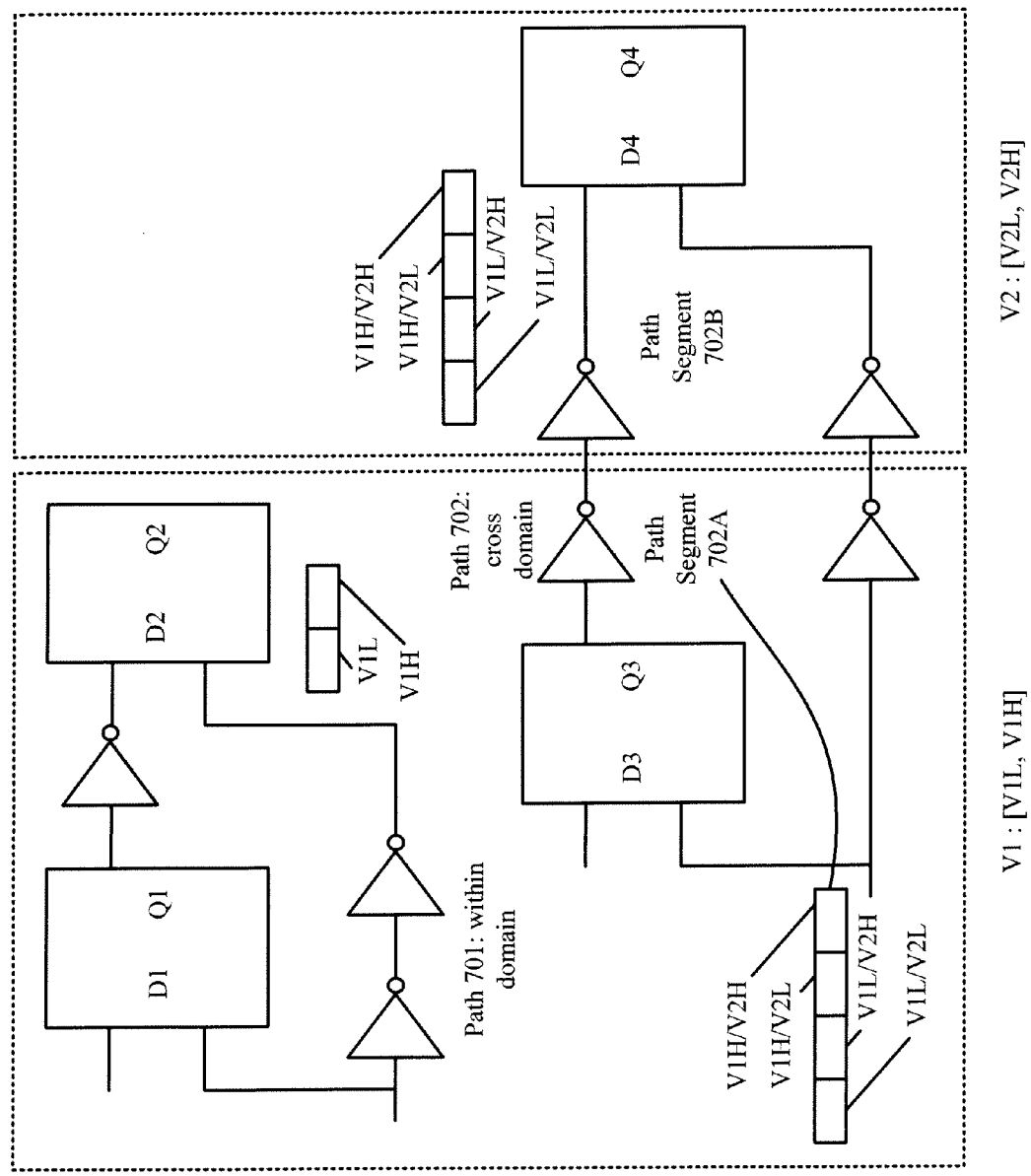
FIG. 7A illustrates a samples-based STA technique that can be used to perform efficient timing analysis for a circuit design with multiple voltage domains.

For example, FIG. 7A shows 2 paths 701 and 702 that are exemplified, respectively, as within-domain and cross-domain paths (for voltage domains V1:[V1L, V1H] and V2: [V2L, V2H]). For within-domain paths, two STA runs are needed to capture the worst-case timing. Thus, for within-domain path 701, samples-based STA can use a vector consisting of two samples (i.e. V1L and V1H) to calculate timing at low/high voltages of domain V1. For cross-domain paths, STA must enumerate every low/high voltage combination across the voltage domains, resulting in $2^N$ STA runs in a vector to capture the worst-case timing, where N is the number of voltage domains. Thus, for cross-domain path 702, consisting of the path segments 702A and 702B, four samples (i.e. V1L/V2L, V1L/V2H, V1H/V2L, and V1H/V2H) can be used to enumerate all possible voltage combinations between the two independent domains. To correctly identify cross-domain paths and determine sample counts for such paths, a separate analysis of circuit topology is needed before timing information is calculated. Samples-based STA can perform multiple voltage domain analysis in a single STA run, thereby eliminating the need for an exponential number of STA runs.

Figure 7B:
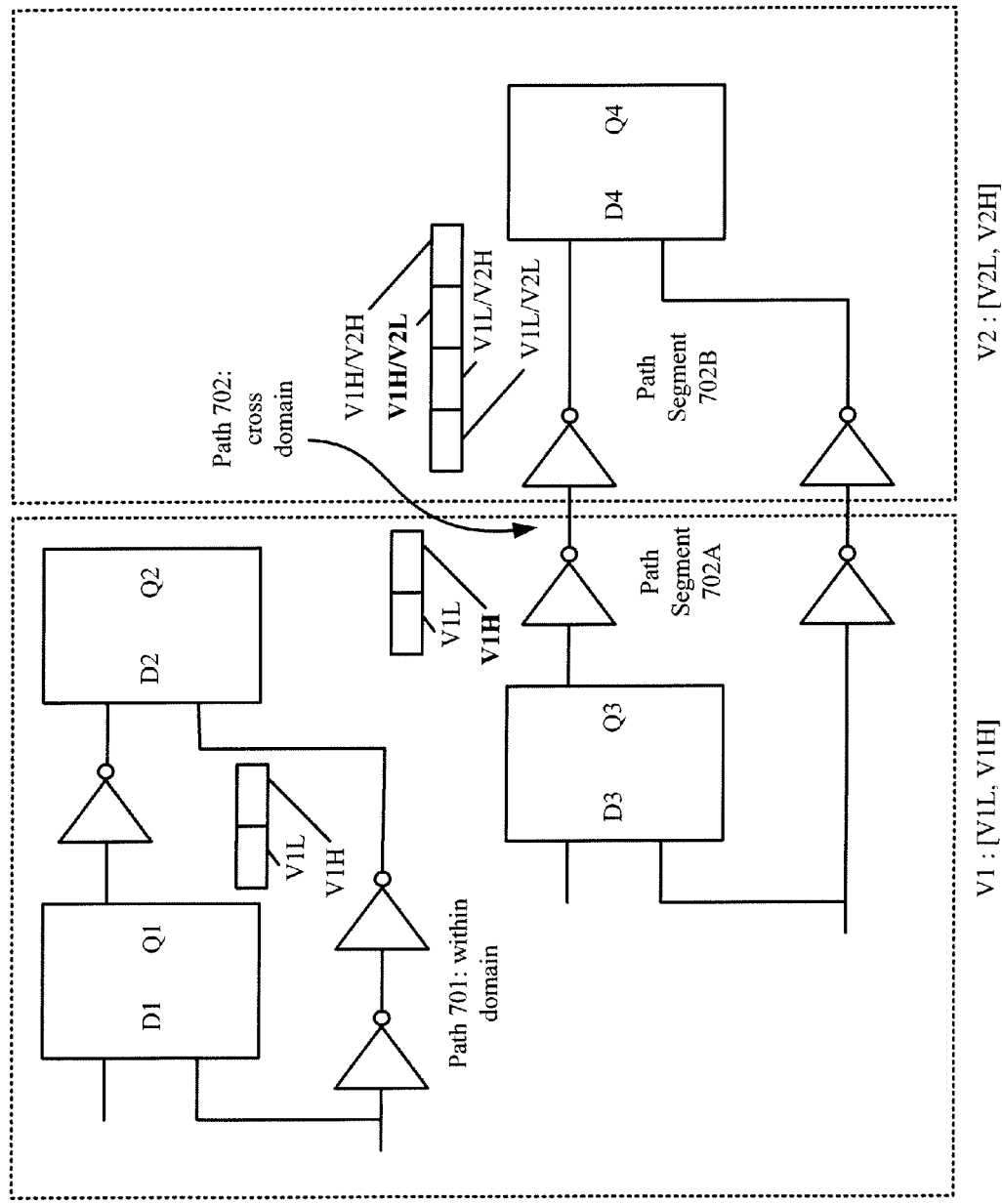
FIG. 7B illustrates another samples-based STA technique that can be used to perform efficient timing analysis for a circuit design with multiple voltage domains.

FIG. 7B illustrates how the samples-based multiple voltage domain analysis described in FIG. 7A can be improved by reducing samples needed for cross-domain paths. In FIG. 7B, for path segment 702A of the cross-domain path 702, which originates in voltage domain V1, only two samples (i.e. V1L and V1H) may be used. The sample count is then doubled at the boundary of domains V1 and V2 for the cross-domain path segment 702B of path 702, which ends in voltage domain V2 (i.e. V1L/V2L, V1L/V2H, V1H/V2L, V1H/V2H). To correctly reconstruct timing information for a given voltage combination, special handing is needed to align the two cross-domain path segments (e.g. path segments 702A and 702B) with different sample counts at domain boundaries. For example, the timing information of the V1H/V2L combination can be obtained by aligning the 2nd sample (V1H) of path 702's vector in domain V1 to the 3rd sample of the vector in domain V2 (V1L/V2H) (samples shown in bold in FIG. 7B for convenience). This enhancement removes the requirement to identify cross-domain paths in a separate circuit analysis. This enhancement also allows cross-domain paths to use a lower sample count adaptively before reaching the next voltage domain, thereby reducing memory and runtime of samples-based STA for multiple voltage domain analysis.

Accordingly, it is intended that the scope of the invention be defined by the following Claims and their equivalents.

The invention claimed is:

1. A method of performing simultaneous multi-corner static timing analysis (STA) on a design for an integrated circuit, the method comprising:
reading design data including a netlist, parasitics, and libraries at a plurality of corners, each corner representing a set of process, temperature, and voltage conditions; and
using the design data as inputs, performing a plurality of operations with a processor to generate timing reports of the design at the plurality of corners, each operation having a single control flow and using vectors of samples for performing the plurality of operations, each sample being a value associated with a corner.

2. The method of claim 1, wherein one operation includes calculating cell and net arc delays.

3. The method of claim 2, wherein the calculating cell and net arc delays includes:
for each cell arc:
performing an arc lookup for each corner;
calculating delays for a select subset of corners; and
estimating delays for all the other corners other than the select subset of corners;
picking a select subset of cell arcs; and
calculating net arc delays based on the select subset of cell arcs.

4. The method of claim 1, wherein one operation includes determining if a transparent latch is borrowing time from or lending time to a next timing stage.

5. The method of claim 4, wherein determining if the transparent latch is borrowing or lending time includes:
for each transparent latch:
computing a timing slack vector using differences between the data arrival times and required times;
computing a delta vector using differences between data-to-output times and clock-to-output times; and
determining whether each sum of each timing slack sample in the timing slack vector and each corresponding delta sample in the delta vector is less than or equal to zero, wherein if so, then a borrow/lend value is equal to zero, and wherein if not, then the borrow/lend value is equal to that timing slack sample.

6. The method of claim 5, wherein a positive borrow/lend value indicates time borrowed from a next timing state and a negative borrow/lend value indicates time lent to the next timing stage.

7. The method of claim 1, wherein one operation includes generating timing slack samples for each edge-triggered latch in the design, each timing slack sample being a difference between a data arrival time and a required time at a data pin of the edge-triggered latch.

8. The method of claim 1, wherein one operation includes removing clock reconvergence pessimism.

9. The method of claim 8, wherein the removing clock reconvergence pessimism includes forming a clock network graph (CNG) for the plurality of corners.

10. The method of claim 9, wherein forming the CNG includes:
for each divergent clock node:
computing rise clock reconvergence pessimism removal (CRPR) samples and fall CRPR samples; and
storing the rise and fall CRPR samples.

11. The method of claim 10, wherein the removing clock reconvergence pessimism further includes:
using the rise and fall CRPR samples, determining whether two nodes in the CNG are mergeable.

12. The method of claim 11, wherein the determining whether the two nodes are mergeable includes:
comparing a first difference between rise CRPRs of the two nodes to a first predetermined threshold;
comparing a second difference between fall CRPRs of the two nodes to a second predetermined threshold; and
merging the two nodes when the first difference is less than the first predetermined threshold and the second difference is less than the second predetermined threshold.

13. A method of performing simultaneous multi-corner static timing analysis (STA) on a design for an integrated circuit, the method comprising:

reading design data including a netlist, parasitics, and libraries for a plurality of corners, each corner representing a set of process, temperature, and voltage conditions;

using the design data, performing delay calculations for cell and net arcs of the design with a processor to generate a plurality of first vectors of samples, each first vector representing one of the plurality of corners, and each sample of each first vector representing a cell or net arc delay value;

performing timing updates using the cell and net delay (first) vectors to generate and propagate arrival and required time (second) vectors throughout a timing graph of the netlist;

deriving a timing slack vector using differences of arrival and required times at every node of the timing graph;

generating timing reports using data from the timing updates; and outputting the timing reports.

14. The method of claim 13, wherein one operation includes using one or more timing metric samples to generate a plurality of critical paths of the netlist across the plurality of corners.

15. The method of claim 14, wherein the one of more timing metric samples represent at least one of timing slack and arrival times.

16. The method of claim 14, wherein the plurality of critical paths are associated with a plurality of most negative slack samples.

17. The method of claim 13, wherein one operation includes timing metrics to generate a timing report for a timing path of the design, the timing report showing summary timing data across the plurality of corners.

18. The method of claim 17, wherein the summary timing data of a timing graph of the design across the plurality of corners is used for engineering change order (ECO) fixing of critical timing paths.

19. The method of claim 18, wherein the ECO fixing across the plurality of corners for each critical timing path includes modifying that critical timing path and/or another design netlist to improve timing slack of that critical timing path to be less than a predetermined threshold.

20. A method of performing simultaneous multi-corner static timing analysis (STA) on a design with multiple voltage domains of which a supply voltage of each domain can vary independently, the method comprising:

reading design data including a netlist, parasitics, and libraries for a plurality of corners, each corner including a set of voltage conditions for low and high voltage limits of each voltage domain;

using the design data to generate a first vector for arcs of cells and nets residing within a voltage domain, the first vector consisting of two samples that represent timing at low and high voltages of the voltage domain;

using the design data to generate a second vector for arcs of cells and nets located in different voltage domains, each sample in the second vector representing timing at a specific voltage combination across multiple voltage domains, wherein a size of the second vector is $2^N$, wherein N is the number of voltage domains;

using a processor, performing timing updates using cell and net delay (first) vectors to generate and propagate arrival and required time (second) vectors throughout a timing graph of the design, and then deriving a timing slack vector as the difference of arrival and required times at every node of the timing graph of the design;

generating timing reports using timing update data, including arrival, required and timing slack vectors, that were generated throughout the timing graph of the design; and outputting the timing reports.

21. A non-transitory computer-readable medium storing computer-executable instructions for performing static timing analysis (STA) for a design of an integrated circuit, which when executed by a computer performs steps comprising:

reading design data including a netlist, parasitics, and libraries at a plurality of corners, each corner representing a set of process, temperature, and voltage conditions; and using the design data as inputs, performing a plurality of operations to generate timing reports of the design at the plurality of corners, each operation having a single control flow and using vectors of samples for performing the plurality of operations, each sample being a value associated with a corner.

22. The computer-readable medium of claim 21, wherein one operation includes calculating cell and net arc delays.

23. The computer-readable medium of claim 22, wherein the calculating cell and net arc delays includes:

for each cell arc:
performing an arc lookup for each corner;
calculating delays for a select subset of corners; and
estimating delays for all the other corners other than the select subset of corners;

picking a select subset of cell arcs; and calculating net arc delays based on the select subset of cell arcs.

24. The computer-readable medium of claim 21, wherein one operation includes determining if a transparent latch is borrowing time from or lending time to a next timing stage.

25. The computer-readable medium of claim 24, wherein the determining if the transparent latch is borrowing time from or lending time to includes:

for each transparent latch:
computing a timing slack vector using differences between data arrival times and required times;
computing a delta vector using differences between data-to-output times and clock-to-output times;
determining whether each sum of each timing slack sample in the timing slack vector and each corresponding delta sample in the delta vector is less than zero,
wherein if so, then a borrow/lend value is equal to zero, and wherein if not, then the borrow/lend value is equal to that timing slack sample.

26. The computer-readable medium of claim 25, a negative timing slack sample indicates time lent to the next timing stage and a positive timing slack sample indicates time borrowed from the next timing stage.

27. The computer-readable medium of claim 21, wherein one operation includes generating timing slack samples for each edge-triggered latch in the design, each timing slack sample being a difference between a data arrival time and a required time at a data pin of the edge-triggered latch.

28. The computer-readable medium of claim 21, wherein one operation includes removing clock reconvergence pessimism.

29. The computer-readable medium of claim 28, wherein the removing clock reconvergence pessimism includes forming a clock network graph (CNG) for the plurality of corners.

30. The computer-readable medium of claim 29, wherein the forming the CNG includes:

for each divergent clock node:
computing rise clock reconvergence pessimism removal (CRPR) samples and fall CRPR samples; and storing the rise and fall CRPR samples.

31. The computer-readable medium of claim 30, wherein the removing clock reconvergence pessimism further includes:
   using the rise and fall CRPR samples, determining whether two nodes in the CNG are mergeable.

32. The computer-readable medium of claim 31, wherein the determining whether the two nodes are mergeable includes:
   comparing a first difference between rise CRPRs of the two nodes to a first predetermined threshold;
   comparing a second difference between fall CRPRs of the two nodes to a second predetermined threshold; and
merging the two nodes when the first difference is less than the first predetermined threshold and the second difference is less than the second predetermined threshold.

\* \* \* \* \*